United States Patent

Szu

[19]

[11] Patent Number: 6,056,576
[45] Date of Patent: May 2, 2000

[54] ZIF SOCKET WITH TOP LOADING CONTACTS

[75] Inventor: Ming-Lun Szu, Taipei, Taiwan

[73] Assignee: Hon Hai Precision Ind. Co., Ltd., Taipei Hsein, Taiwan

[21] Appl. No.: 09/299,825

[22] Filed: Apr. 26, 1999

[51] Int. Cl.[7] .................................................. H01R 4/50
[52] U.S. Cl. ............................................. 439/342; 439/259
[58] Field of Search .................................. 439/342, 259, 439/861, 862, 513

[56] References Cited

U.S. PATENT DOCUMENTS

| | | | |
|---|---|---|---|
| 5,044,973 | 9/1991 | Noda et al. | 439/342 |
| 5,286,208 | 2/1994 | Matsuoka | 439/862 |
| 5,292,260 | 3/1994 | Sinisi et al. | 439/861 |
| 5,489,218 | 2/1996 | McHugh | 439/342 |
| 6,022,236 | 2/2000 | McHugh et al. | 439/342 |

Primary Examiner—Paula Bradley
Assistant Examiner—Tho D. Ta
Attorney, Agent, or Firm—Wei Te Chung

[57] ABSTRACT

An electrical socket comprises a rectangular base defining a plurality of passageways therein each of which has an upper cavity and a lower cavity communicated with each other. The upper cavity has an opening exposing to exterior larger than another opening of the lower cavity exposing to exterior. A vertical inner wall is formed in each passageway and extending through the upper cavity and the lower cavity. A plurality of contacts are received in the passageways and each contact includes an upper open-looped portion connected to an engagement portion connected to a tail portion. A portion of the upper open-looped portion is coplanar with the engagement portion and the tail portion so that the coplanar portion of the open-looped portion, the engagement portion and the tail portion may be guided by the vertical inner wall when the contact is configured downward into the passageway.

8 Claims, 5 Drawing Sheets

ZIF SOCKET WITH TOP LOADING CONTACTS

BACKGROUND OF THE INVENTION

1. Field of The Invention

The present invention relates to a zero insertion force socket having a cover movable with respect to a base thereof, particularly one which has top loading contacts cooperating with relatively narrow openings of passageways for prevention of unwanted solder sputtered to any other portion than the solder tail of the contact.

2. The Prior Art

Zero insertion force (ZIF) sockets have been used to connect a CPU to a printed circuit board for years. Normally, this socket needs a relatively long pitch for accommodating a lead-in distance of each contact which allows a corresponding CPU pin to be inserted into the socket with substantially zero insertion force firstly and then moved by a cover of the socket for this lead-in distance to abut against contacting portion of the contact in the socket. These sockets may be referred to U.S. Pat. Nos. 5,057,031 and 5,730,615. For effectively utilizing the space of the socket and lowering the profile thereof a low profile socket in U.S. application Ser. No. 09/146,998 has been proposed which belongs to the same assignee of this application. Although this configuration works well in many aspects, a portion of the contact other than the solder tail thereof is apt to be attached with solder sputtered during a soldering procedure. This unwanted solder when retained in the base of the socket is apt to negatively affect the operation of the socket. The reason causing the unwanted solder retained in the base is in that the contact is a bottom loading type which needs a relatively large opening at the bottom of the base for entrance of the contact during assembling of the contact into the base. Referring to FIGS. 4 and 5, a conventional contact 4 comprises an engagement plate 41 from which a stationary contacting portion 44 extends upward, a curved portion 45 connected to the stationary contacting portion 44, and a movable contacting portion 46 connected to the curved portion 45 and facing inward the stationary contacting portion 44. The contact 4 is loaded into a passageway 50 of a base 5 from a bottom opening 60 thereof. The engagement plate 41 has barbs 411 formed in two ends thereof for engagement with inner walls 55 (only one is shown) of a corresponding passageway of a base 5. The movable contacting portion 46 is forced to expand outward by the CPU pin when the CPU pin is driven by the cover of the socket to move for the lead-in distance within the contact. A solder tail 43 extends substantially perpendicular to the engagement plate 41 for attachment of a solder ball thereto. It can be seen that after the contact 4 has been configured in the passageway 50, relatively large space may exist in the opening 60 which constitutes a path for sputtered solder to attach to other portions of the contact 4 other than the solder tail 13 thereby causing problem as mentioned. It is requisite to provide a new structure of the contact and the passageway by which the unwanted sputtered solder is prevented from attaching to those portions other than the solder tail of the contact.

SUMMARY OF THE INVENTION

The primary purpose of the present invention is to provide an improved low profile socket having top loading contacts and the passageways formed in the base for receiving the contacts.

In accordance with one aspect of the present invention, an electrical socket comprises a rectangular base defining a plurality of passageways therein each of which has an upper cavity and a lower cavity communicated with each other. The upper cavity has an opening exposing to exterior larger than another opening of the lower cavity exposing to exterior. A vertical inner wall is formed in each passageway and extending through the upper cavity and the lower cavity. The open-looped portion has a first horizontal cross-sectional area larger than a second horizontal cross-sectional area of the engagement portion which is larger than a third horizontal cross-sectional area of the tail portion. A plurality of contacts are received in the passageways and each contact includes an upper open-looped portion connected to an engagement portion connected to a tail portion. A portion of the upper open-looped portion is coplanar with the engagement portion and the tail portion so that the coplanar portion of the open-looped portion, the engagement portion and the tail portion may be guided by the vertical inner wall when the contact is configured downward into the passageway.

DETAILED DESCRIPTION OF THE PREFERRED EMBODIMENT

Figure 1:
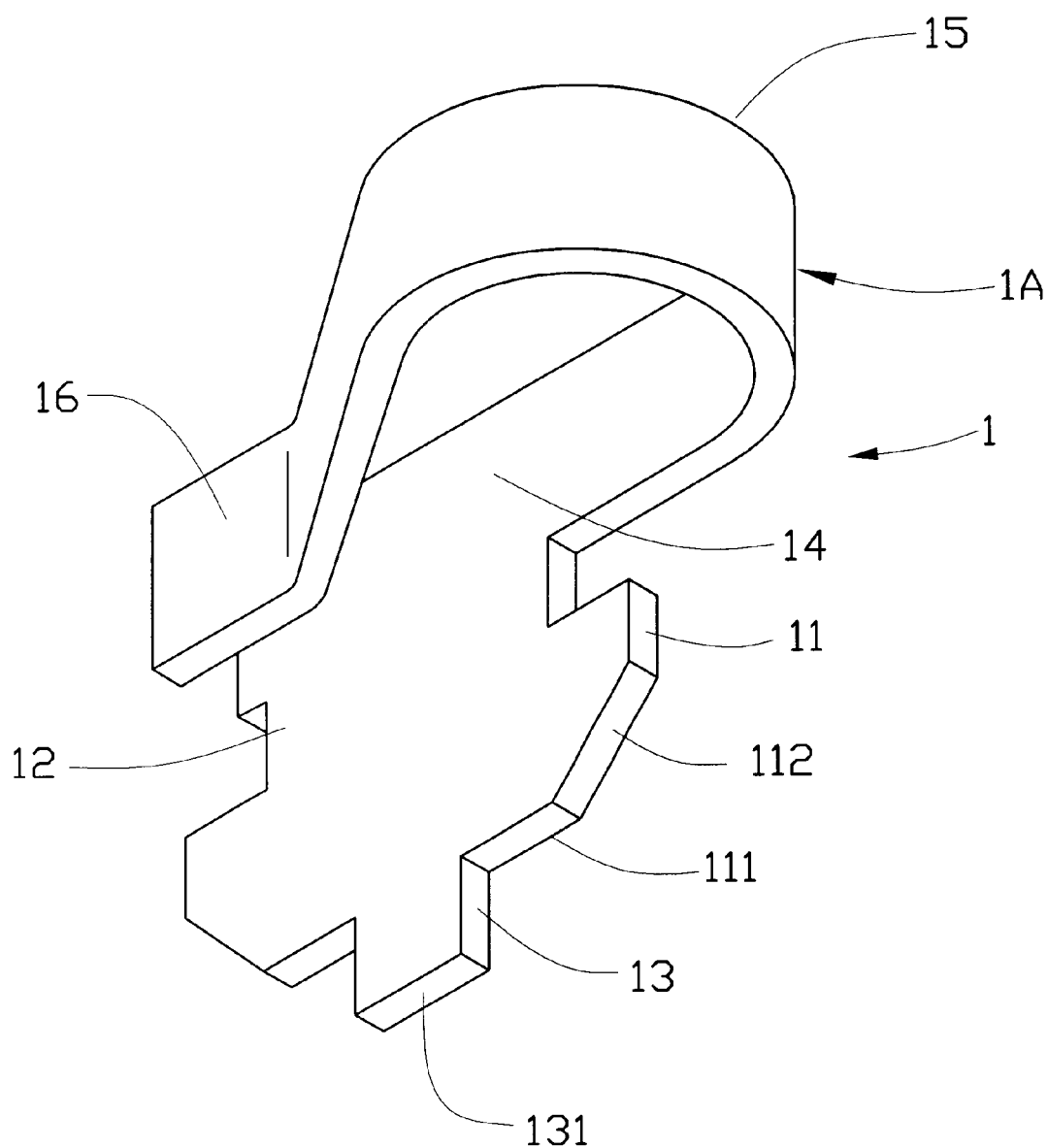
FIG. 1 is a top loading contact used in a socket of the present invention.

Referring to FIG. 1, a top loading contact 1 in accordance with the present invention comprises an engagement plate 11 having a horizontal shoulder portion 111 and a slant shoulder portion 112 connected to the horizontal shoulder portion 111. An upper compliant pin section 12 extends upward from an upper edge of the engagement plate 11. A lower compliant pin section 13 extends downward from a lower edge of the engagement plate 11 and a bottom face 131 thereof is used as a solder tail for attachment of a solder ball (not shown) thereto. The upper compliant pin section 12 is connected to an upper open-looped portion 1A which comprises a stationary contacting portion 14, a curved portion 15, and a movable contacting portion 16. The stationary contacting portion 14 is connected to the upper compliant pin section 12 and substantially coplanar with the upper compliant pin section 12 and the engagement plate 11. The curved portion 15 is connected to the stationary contacting portion 14 and the movable contacting portion 16 is connected to the curved portion 15 and faces to the stationary contacting portion 14.

Figure 2:
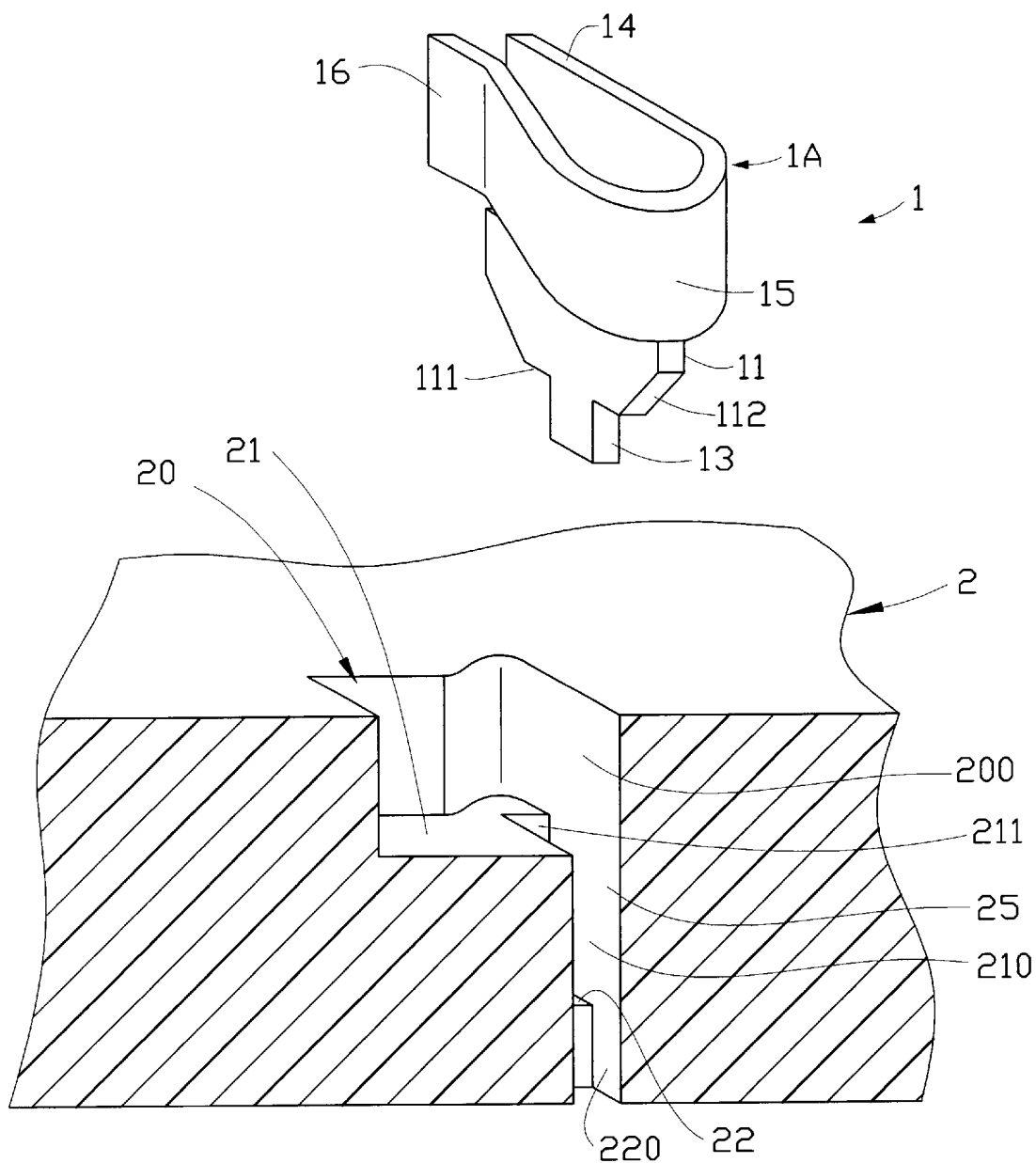
FIG. 2 is an exploded view of the top loading contact of FIG. 1 and the corresponding passageway of a base for receiving the top loading contact.
Figure 3:
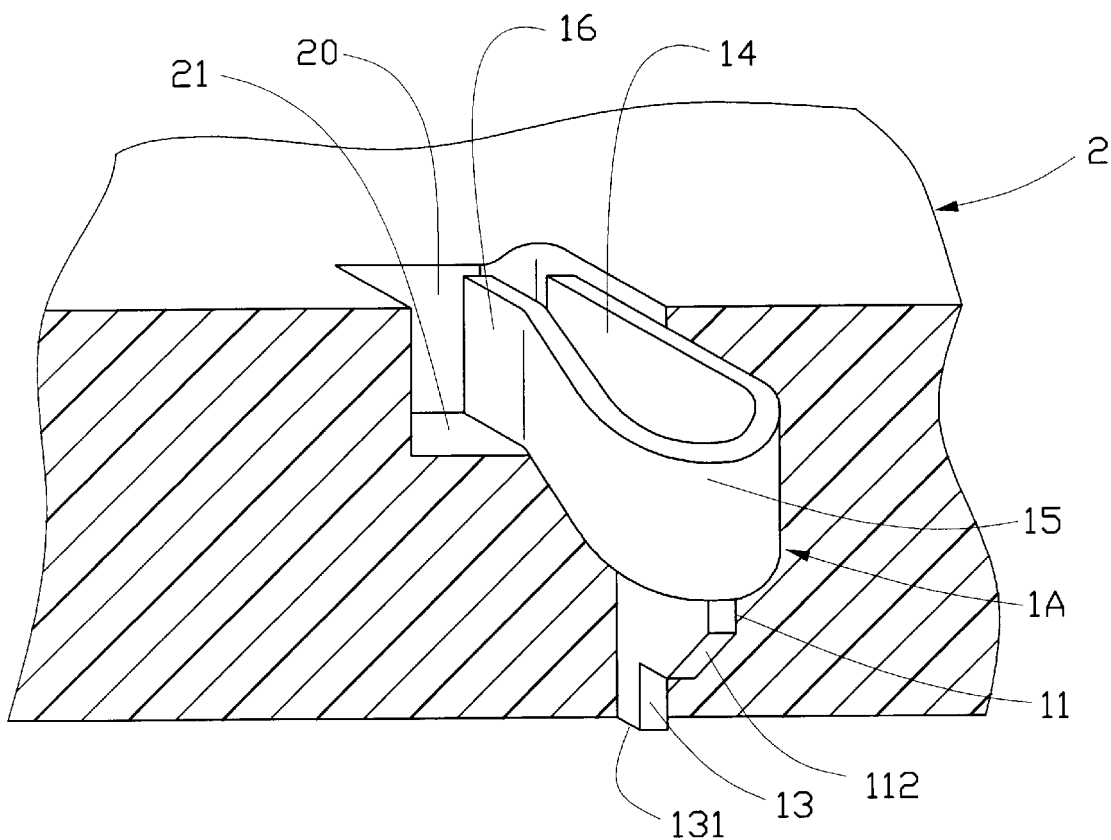
FIG. 3 is an assembled view of the contact and the passageway of FIG. 2.
Figure 4:
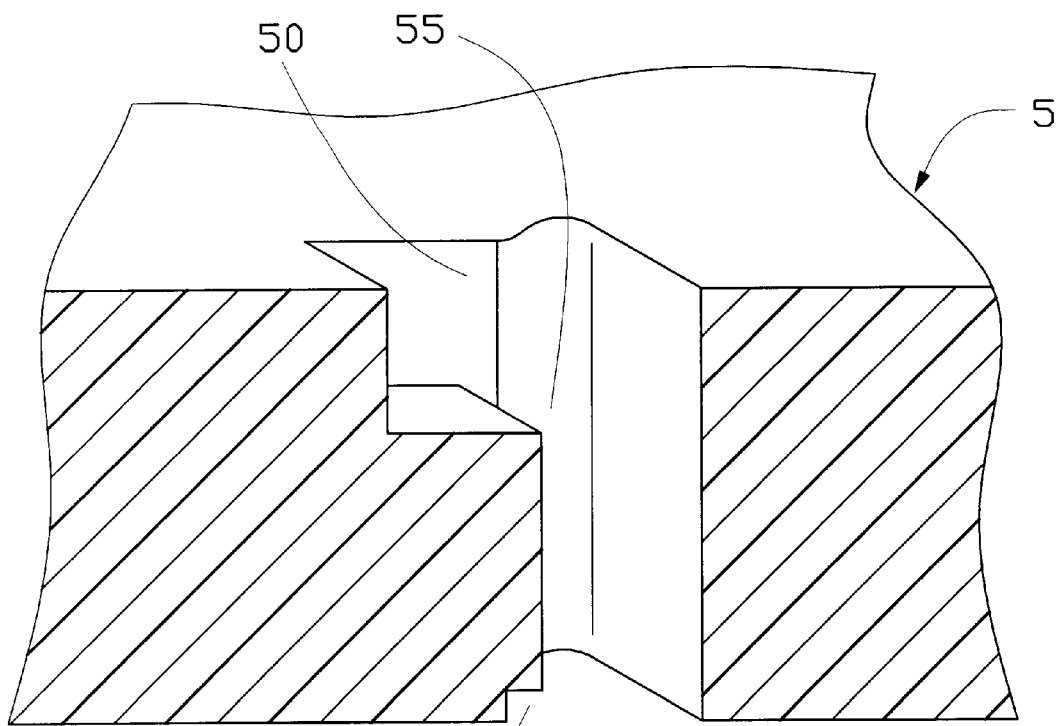
FIG. 4 is a conventional contact and the passageway of a base for receiving the contact.
Figure 4:
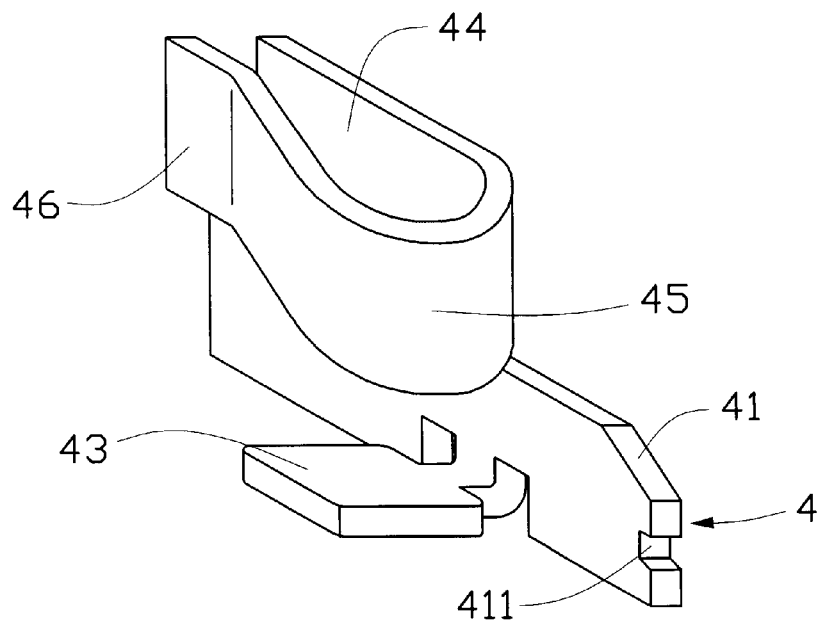
Figure 5:
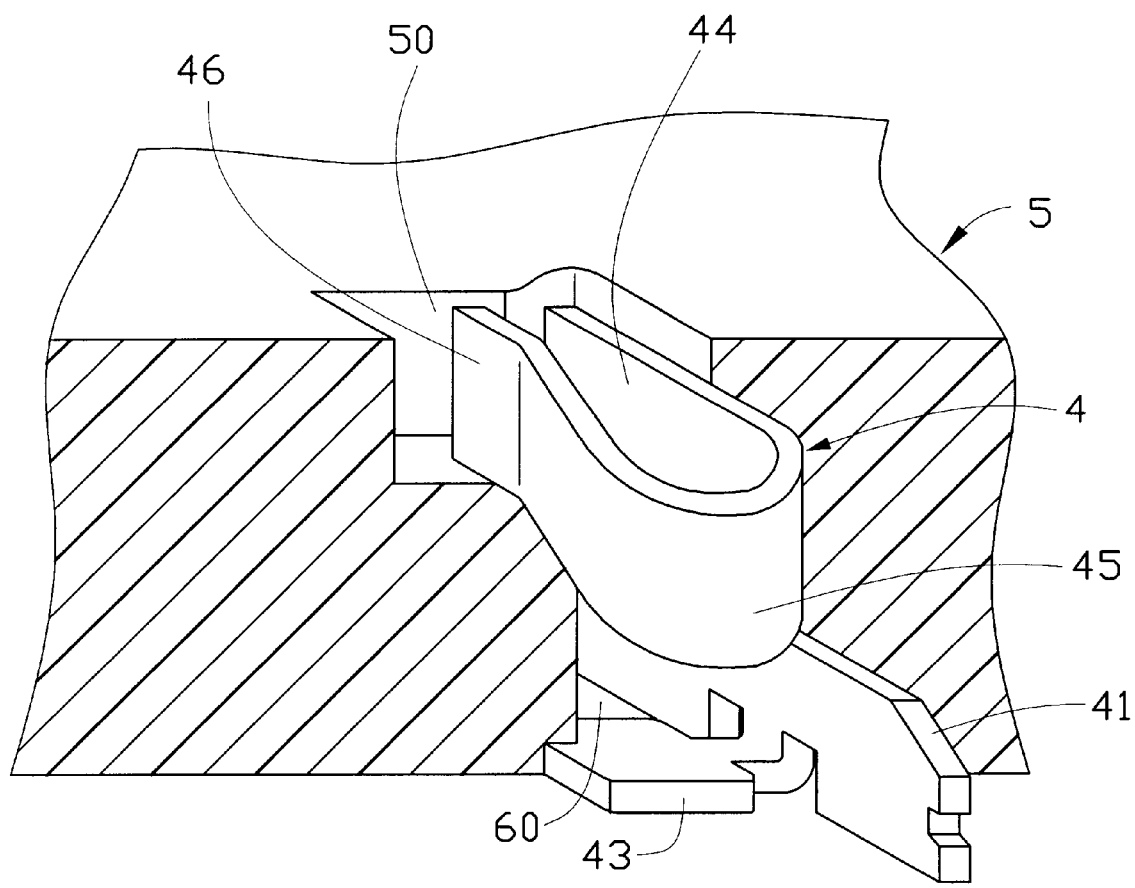
FIG. 5 is an assembled view of the contact and the passageway of FIG. 4.

Also referring to FIGS. 2 and 3, a base 2 forms a plurality of passageways 20 (only one is shown) therein for receiving the contacts 1 of FIG. 1. The top loading contact 1 of the present invention has a largest cross-sectional area at the upper open-looped portion 1A, a middle cross-sectional area at the engagement plate 11, and a smallest cross-sectional area at the lower compliant pin section 13. Similarly, each passageway 20 has a similar volume arrangement from top to bottom thereof. Each passageway 20 includes from top to bottom an upper cavity 200 for receiving the upper open-looped portion 1A, a middle cavity 210 for receiving the upper compliant pin section 12 and the engagement plate 11, and a lower cavity 220 for receiving the lower compliant pin section 13. A guiding wall 25 vertically extends in the passageway 20 and extending through the upper cavity 200, the middle cavity 210 and the lower cavity for facilitating the installation of the contact 1 into the passageway 20, wherein the coplanar portions including the stationary contacting portion 14, the upper compliant pin section 12, the engagement plate 11, and the lower compliant pin section 13 are substantially slid over the guiding wall 25 during installation. The upper cavity 200 has a first platform 21 formed at a bottom thereof for rest of the curved portion 15 and the movable contacting portion 16 of the upper open-looped portion 1A. Another function of the first platform 21 is the separation and prevention of any solder from attaching to the curved portion 15 and the movable contacting portion 16. Since the contact 1 is retained within the passageway 20 mainly by the engagement plate 11, the movable contacting portion 16 can be moved by the inserted CPU pin easily without necessity of considering the minor resistance to the first platform 21. Moreover, the contact 1 when fixed in the passageway 20, the compliant pin sections 12 and 13 thereof are proximate to the guiding wall 25 not directly abutting against the latter. In this situation, the upper compliant pin section 12 can deform when the CPU pin is moved to contact the stationary contacting portion 14 and the movable contacting portion 16. The second compliant pin section 13 can deform during a soldering procedure for releasing tension due to different coefficients of thermal expansion of the base 2 and the printed circuit board (not shown) on which the base 2 is mounted.

The middle cavity 210 has a second platform 22 formed at a bottom portion thereof for rest of the horizontal shoulder portion 111 of the engagement plate 11. The horizontal shoulder portion 111 of the engagement plate 11 blocks any solder sputtered upward from the bottom face 131 of the second compliant pin section 13 during a soldering procedure. The slant shoulder portion 112 of the engagement plate 11 facilitates the engagement plate 11 to be forcibly engaged with opposite inner walls 211 (only one is shown) around the middle cavity 210 of the passageway 20 when the contact 1 is loaded downward the passageway 20.

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. An electrical socket comprising:

a rectangular base defining a plurality of passageways therein each of which has an upper cavity and a lower cavity communicated with each other, wherein an opening of the upper cavity exposing to exterior is larger than an opening of the lower cavity exposing to exterior;

a vertical inner wall formed in each passageway and extending through the upper cavity and the lower cavity;

a plurality of contacts received in the passageways and each contact including an upper open-looped portion comprises a first contacting portion connected to a curved portion connected to a second contacting portion which faces the first contacting portion, the upper open-looped portion connected to an engagement portion connected to a tail portion, wherein the first contacting portion of the upper open-looped portion has a first horizontal cross-sectional area larger than a second horizontal cross-sectional area of the engagement portion which is larger than a third horizontal cross-sectional area of the tail portion and the first contacting portion of the upper open-looped portion is coplanar with the engagement portion and the tail portion so that the coplanar portion of the first contacting portion of the upper open-looped portion, the engagement portion and the tail portion can be guided by the vertical inner wall when the contact is configured downward into the passageway.

2. The electrical socket as claimed in claim 1, wherein the engagement portion having a horizontal shoulder portion and a slant shoulder portion connected to the horizontal shoulder portion.

3. The electrical socket as claimed in claim 2, wherein the tail portion extending perpendicularly from the horizontal shoulder portion.

4. The electrical socket as claimed in claim 3, wherein a first platform is formed at a bottom of the upper cavity of the passageway for rest of the curved portion and the second contacting portion of the contact.

5. The electrical socket as claimed in claim 4, wherein the passageway has a middle cavity defined between the upper cavity and the lower cavity so that the upper open-looped portion of the contact is received in the upper cavity, the engagement plate is received in the middle cavity, and the tail portion is received in the lower cavity.

6. The electrical socket as claimed in claim 5, wherein the middle cavity has a second platform formed at a bottom portion thereof for rest of the horizontal shoulder portion of the engagement plate.

7. The electrical socket as claimed in claim 6, wherein the contact has a first compliant pin section connected between the first contacting portion and the engagement plate and the first compliant pin section is narrower than the first contacting portion and the engagement plate.

8. The electrical socket as claimed in claim 7, wherein the lower cavity is so dimensioned that the tail portion of the contact is deformable therein.

* * * * *